United States Patent [19]
Ball et al.

[11] Patent Number: 4,803,360
[45] Date of Patent: Feb. 7, 1989

[54] INFRARED RADIATION DETECTOR WITH FLANGED SEMICONDUCTOR WINDOW

[75] Inventors: Patrick J. R. Ball, Southampton; David N. Vaughan, Totton, both of England

[73] Assignee: U.S. Philips Corp., New York, N.Y.

[21] Appl. No.: 102,309

[22] Filed: Sep. 25, 1987

Related U.S. Application Data

[63] Continuation of Ser. No. 21,565, Mar. 2, 1987, which is a continuation of Ser. No. 766,177, Aug. 15, 1985.

[30] Foreign Application Priority Data

Sep. 19, 1984 [GB] United Kingdom ............... 8423689

[51] Int. Cl.⁴ ................................................ G01J 5/08
[52] U.S. Cl. ............................ 250/338.3; 250/338.1; 250/353
[58] Field of Search ............... 250/200, 239, 338 R, 250/338 FE, 338 PY, 338 SE, 353; 374/130

[56] References Cited

U.S. PATENT DOCUMENTS 3,281,606 10/1966 Lueck ................................. 250/239
4,425,504 1/1984 Turnbull et al. ..................... 250/353
4,437,002 3/1984 Taniguchi et al. .................. 250/338
4,616,136 10/1986 Ball et al. ........................... 250/338

FOREIGN PATENT DOCUMENTS 1504283 3/1978 United Kingdom .
2133615 7/1984 United Kingdom ......... 250/338 PY Primary Examiner—Janice A. Howell
Assistant Examiner—Constantine Hannaher
Attorney, Agent, or Firm—William L. Botjer

[57] ABSTRACT

An infrared radiation detector comprises a pyroelectric detector element in a hermetically sealed housing. The housing comprises a base and a cover. The cover has an aperture surrounded by an inwardly directed flange. A self-locating window capable of transmitting infrared radiation is fastened to the flange with adhesive to close the aperture. The window comprises a first portion which is adapted to fit within and which is located within the aperture. A second wider portion forms a peripheral shoulder which bears against the cover's flange. The second portion of the window is present outside the cover, giving a wide field of view.

5 Claims, 1 Drawing Sheet

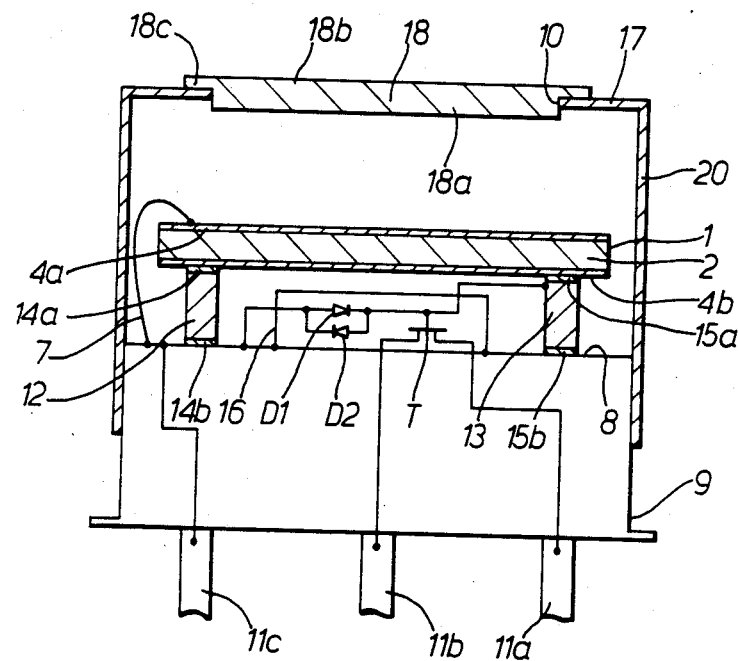

INFRARED RADIATION DETECTOR WITH FLANGED SEMICONDUCTOR WINDOW

This is a continuation of application Ser. No. 021,565 filed Mar. 2, 1987, which is a continuation of application Ser. No. 766,177, filed Aug. 15, 1985.

BACKGROUND OF THE INVENTION

This invention relates to an reinforced radiation detector comprising a pyroelectric detector element in a hermetically sealed housing.

Infrared radiation detectors comprising pyroelectric detector elements are often referred to briefly as pyroelectric detectors. Pyroelectric detectors are used for a variety of purposes, for example in remote switching systems, in intruder alarms, and in movement sensors generally. Such sensors rely on the fact that a human being naturally provides a moving source of infrared radiation as he walks about or even as he moves only part of his body, for example by waving his hand. The radiation which he emits is converted by the pyroelectric detector into an electric signal which can be used, for example, to actuate an alarm or to switch lights on or off.

Conventionally, the pyroelectric detector element is mounted in a hermetically sealed housing to shield it from environmental influences. The housing comprises a canister with an aperture which is closed by a window made of a material, such as silicon, which transmits the infrared radiation to be detected. Pyroelectric detectors in which the window is fixed over the aperture and inside the canister are disclosed, for example, in British patent application No. GB 2,133,615 and in British patent application No. 8332264 (corresponding to U.S. Pat. No. 4,616,136). In both cases, however, it is difficult to locate the window correctly over the aperture.

SUMMARY OF THE INVENTION

According to the present invention, an infrared radiation detector comprises a pyroelectric detector element in a hermetically sealed housing. The housing comprises a canister having an aperture and an inwardly directed flange surrounding the aperture. A window capable of transmitting the radiation to be detected is provided to close the aperture. The window comprises a first portion which is adapted to fit within and which is located within the aperture. The window also comprises a second wider portion outside the canister. The second portion forms a peripheral shoulder which bears against the flange.

A detector according to the invention has the advantage that the window is self-locating with respect to the aperture in the canister. This simplifies the step of providing the window in the correct position during detector manufacture and facilitates automated assembly.

Also, the window need not be much wider than the aperture in the canister. Therefore the amount—and hence the cost—of the window material can be kept to a minimum.

Moreover, as compared with the prior art detectors mentioned above, the window has a portion fitted within the aperture which form a greater area of contact between the window and the flange of the canister. The greater contact arm forms a better seal.

Further the second portion (the peripheral shoulder) of the window which is present outside the canister causes incident radiation to be refracted before entering the aperture in the canister. As a result the field of view of the detector is advantageously increased.

BRIEF DESCRIPTION OF THE DRAWINGS

FIG. 1 is a partly schematic, partly cross-sectional view of an infrared radiation detector according to the invention.

DESCRIPTION OF THE PREFERRED EMBODIMENTS

The pyroelectric detector shown in FIG. 1 comprises a pyroelectric detector element 1 formed from a body 2 of pyroelectric ceramic material, such as lanthanum and manganese doped lead zirconate titanate. (For more information about this material, see U.K. Pat. No. 1,504,283).

The pyroelectric body—which may be 2 mm long, 1 mm wide, and 150 microns thick—is sandwiched between two nichrome electrodes 4a and 4b. The electrodes are substantially transparent to infrared radiation of a wavelength at which the detector is responsive.

The upper electrode 4a is electrically connected by a wire bond 7 to the surface 8 of the base 9 of a hermetically sealed housing. The housing may, for example, have a conventional TO-5 outline.

The housing also comprises a cover member in the form of an open ended cylindrical canister 20 and canister 20 is secured to the rim of the base 9 in known manner. The housing may be evacuated or it may be filled with a gas, such as dry nitrogen, which is relatively inert with respect to the component parts of the detector within the housing.

The canister 20 has an aperture 10 approximately 5 mm square centrally disposed in the end face. The end face comprises an inwardly directed flange 17 surrounding the aperture 10. The aperture 10 is closed by a window 18 which may be made for example of silicon silicon transmits radiation in the wavelength range from approximately 1 to 15 μm.

The window 18 comprises a lower portion 18a which is approximately 5 mm square and is fitted within the aperture 10. The window 18 also comprises a wider upper portion 18b forming a peripheral shoulder 18c. The shoulder 18c protrudes approximately 0.5 mm laterally and bears against the flange 17 on the canister 20.

The overall thickness of the window 18 is approximately 1 mm divided equally between the first and second portions 18a and 18b respectively. The window is fastened to the flange 17 with adhesive provided between the downwardly directed face of shoulder 18c and the upwardly directed face of flange 17 and between the respective facing edges of the portion 18a of the window and the flange 17.

Three conductive leads 11a, 11b, and 11c extend from the base 9 of the housing for making external electrical connections to the detector. Two of the leads 11a and 11b extend through the base 9 to form terminals (not shown) which protrude above surface 8. The third lead 11c is conductively connected to surface 8, and hence also to the upper electrode 4a of the detector element.

The detector element 1 is maintained spaced above the base 9 by two supporting pillars 12 and 13 of equal height. The pillar 12, which is electrically insulating, may be made of a ceramic such as high density alumina. Pillar 12 is fastened between the detector element 1 and the surface 8 of base 9 using an insulating adhesive 14a and 14b at its upper and lower ends, respectively.

The pillar 13, which is electrically conductive, may be either made of an electrically conductive material or, alternatively, an insulating material such as alumina but with a conductive coating of, for example, gold. The upper end of pillar 13 is fastened and electrically connected to the lower electrode 4b of detector element 1 with a conductive adhesive 15a. The lower end is fastened to the surface 8 of base 9 with an insulating adhesive 15b.

The conductive adhesive 15a may be Ablebond 36/2 (Trade Mark) available from Ablestick laboratories, U.S.A. The nonconductive adhesive may be a conventional epoxy adhesive.

As shown schematically in FIG. 1, the lower electrode 4b of detector element 1 is connected electrically, via the pillar 13, to the gate of a field effect transistor T. Two diodes D1 and D2 in parallel opposition are connected between the gate of the transistor T and the lead 11c (via surface 8) to provide a gate leakage path for the transistor T. The source and drain of the transistor T are connected to the leads 11a and 11b via the terminals (not shown) which protrude above the surface 8 as mentioned above.

The circuit arrangement comprising the transistor T and diodes D1 and D2 may, for example, be formed in a single semiconductor chip contained in an encapsulating package 16 such as a plastic encapsulated microminiature package.

We claim:

1. An infrared radiation detector comprising:
    a canister having an inwardly directed flange defining an aperture in the canister;
    a pyroelectric detector element in the canister; and
    a semiconductor window closing the aperture, said window transmitting radiation to be detected, said canister and window forming a hermetically sealed housing;
    characterized in that:
    the window has a first portion which is adapted to fit in and which is directly located in the aperture; and
    the window has a second portion which is wider than the first portion, which is located outside the canister, and which forms a peripheral shoulder bearing directly against the flange.

2. An infrared radiation detector as claimed in claim 1, characterized in that the window is fastened to the canister by an adhesive arranged between the peripheral shoulder of the window and the flange.

3. A method of manufacturing an infrared radiation detector, said method comprising the steps of:
    providing a canister;
    providing an inwardly directed flange integral with the canister, said flange defining an aperture in the canister; and then
    hermetically sealing a window to the flange over the aperture, said window transmitting radiation to be detected, said window having a first portion which is fit in and which is directly located in the aperture, said window having a second portion which is wider than the first portion, said second portion being located outside the canister and forming a peripheral shoulder bearing directly against the flange.

4. A method as claimed in claim 3, characterized in that the window is made of a semiconductor material.

5. A method as claimed in claim 4, characterized in that the step of hermetically sealing the window comprises the step of providing an adhesive between the peripheral shoulder of the window and the flange.

* * * * *